United States Patent
Adema et al.

(10) Patent No.: US 9,726,348 B2
(45) Date of Patent: Aug. 8, 2017

(54) WAVELENGTH CONVERSION MATERIAL ARRAY

(71) Applicant: CHRISTIE DIGITAL SYSTEMS USA, INC., Cypress, CA (US)

(72) Inventors: Daniel Robert Adema, Kitchener (CA); Graham Hill, Waterloo (CA); Simon Guthrie, Kitchener (CA)

(73) Assignee: CHRISTIE DIGITAL SYSTEMS USA, INC., Cypress, CA (US)

( * ) Notice: Subject to any disclaimer, the term of this patent is extended or adjusted under 35 U.S.C. 154(b) by 246 days.

(21) Appl. No.: 14/639,269

(22) Filed: Mar. 5, 2015

(65) Prior Publication Data

US 2016/0258597 A1 Sep. 8, 2016

(51) Int. Cl.

| | |
|---|---|
| *F21S 6/00* | (2006.01) |
| *F21V 9/16* | (2006.01) |
| *H01L 33/50* | (2010.01) |
| *H01L 33/58* | (2010.01) |
| *H01S 5/00* | (2006.01) |
| *F21V 29/70* | (2015.01) |
| *F21V 5/00* | (2015.01) |
| *F21V 7/00* | (2006.01) |
| *F21V 13/04* | (2006.01) |

(52) U.S. Cl.
CPC ............... *F21V 9/16* (2013.01); *F21V 5/008* (2013.01); *F21V 7/0008* (2013.01); *F21V 13/04* (2013.01); *F21V 29/70* (2015.01); *H01L 33/508* (2013.01); *H01L 33/58* (2013.01); *H01S 5/005* (2013.01)

(58) Field of Classification Search
CPC . F21V 9/16; F21V 29/70; F21V 5/008; F21V 7/0008; F21V 13/04; H01L 33/508; H01L 33/58; H01S 5/005

USPC ........................................................ 362/257
See application file for complete search history.

(56) References Cited

U.S. PATENT DOCUMENTS

| | | | |
|---|---|---|---|
| 3,639,138 A | | 2/1972 | Shortes |
| 4,023,064 A | * | 5/1977 | Schagen ................. H01J 43/22 |
| | | | 313/105 CM |

(Continued)

FOREIGN PATENT DOCUMENTS

| | | |
|---|---|---|
| EP | 1605199 A2 | 12/2005 |
| WO | WO-2009115976 A1 | 9/2009 |

OTHER PUBLICATIONS

European Search Report dated Jul. 12, 2016 for European Patent Application No. 6155480.3.

*Primary Examiner* — Bryon T Gyllstrom
(74) *Attorney, Agent, or Firm* — Perry + Currier, Inc.

(57) ABSTRACT

A wavelength conversion material array is provided, including a system comprising: a light source configured to emit excitation light at an excitation wavelength; a heatsink; a wavelength conversion material located on the heatsink, the wavelength conversion material comprising a relative wavelength conversion area of unity divided into an array of spots, a number of the spots in a range of 4 to 12, the wavelength conversion material configured to emit light at a wavelength greater than the excitation wavelength when irradiated by the excitation light; and, an array of lenslets configured to: receive the excitation light from the light source and irradiate each of the spots of the wavelength conversion material with the excitation light, the lenslets in a one-to-one relationship with the number of spots; and collect the light emitted by the wavelength conversion material.

18 Claims, 9 Drawing Sheets

(56) References Cited

U.S. PATENT DOCUMENTS

| | | | | |
|---|---|---|---|---|
| 5,835,515 A | * | 11/1998 | Huang | G02B 6/4249 |
| | | | | 372/36 |
| 6,400,513 B1 | * | 6/2002 | Southwell | G02B 6/425 |
| | | | | 359/618 |
| 8,132,919 B2 | * | 3/2012 | Harland | G02B 7/1825 |
| | | | | 353/119 |
| 8,142,021 B2 | * | 3/2012 | Silverstein | G03B 35/26 |
| | | | | 348/51 |
| 2004/0212290 A1 | * | 10/2004 | Ito | B82Y 30/00 |
| | | | | 313/479 |
| 2007/0085468 A1 | * | 4/2007 | Nakamura | H01J 29/30 |
| | | | | 313/496 |
| 2009/0122272 A1 | * | 5/2009 | Silverstein | G02B 27/0905 |
| | | | | 353/81 |
| 2010/0149222 A1 | * | 6/2010 | Welford | H01S 3/0941 |
| | | | | 345/690 |
| 2014/0055859 A1 | * | 2/2014 | Vasylyev | G02B 5/0205 |
| | | | | 359/593 |
| 2014/0084325 A1 | | 3/2014 | Yamanaka et al. | |
| 2016/0010811 A1 | * | 1/2016 | Benitez | F21K 9/54 |
| | | | | 362/509 |
| 2016/0212804 A1 | * | 7/2016 | Peeters | C09K 11/0883 |
| 2016/0369993 A1 | * | 12/2016 | Hikmet | F21V 29/506 |

* cited by examiner

WAVELENGTH CONVERSION MATERIAL ARRAY

FIELD

The specification relates generally to display systems, and specifically to a system that includes a wavelength conversion material array.

BACKGROUND

A limiting factor in the performance of laser-phosphor illumination systems can be a high energy density of the illuminated spot, as compared to non-laser systems, and an ability (or rather an inability) to remove heat energy from the spot before thermal damage occurs. Numerous methods have been used to distribute the thermal energy, for example by rotating or translating the phosphor or illuminated spot, or by increasing the spot size and therefore reducing the energy density. However, these approaches can result in an increase in system complexity and/or in diminished optical performance.

SUMMARY

In general, this disclosure is directed to a system that includes a wavelength conversion material on a heatsink, the wavelength conversion material having a relative area of unity, but divided into an array of 4 to 12 spots. A distance between the spots is selected to balance optical collection efficiency with heat flow in the system. A lenslet array is used to distribute excitation light from an excitation light source, such as a laser, to each of the spots in the array, and then collect light emitted from the spots. The array of spots replaces a single spot of wavelength conversion material of the prior art: a combined relative area of unity of the spots equals a relative area of unity of one larger original spot (the combined area not including spaces between the spots). Thermally, the energy density in the wavelength conversion material remains unchanged, however by separating the wavelength conversion material into an array of smaller spots, the heatsink effectiveness can be improved and therefore the phosphor can be more effectively cooled as compared to systems with one large spot of wavelength conversion material. This can permit higher energy levels incident to the wavelength conversion material (e.g. including, but not limited to, phosphors) and hence can therefore generate more light.

However, other factors can be used to determine a configuration of the spots. For example, one or more of $5d \leq t \leq 25d$ and $10d \leq t \leq 20d$, where d is a centre-to-centre distance between the spots and t is a largest lateral dimension of the spots, can be used to select the centre-to-centre distance between the spots; and/or a distance between a light emitting surface of the spots and a light receiving surface of the lenslets, and a centre-to-centre distance between the spots, can be selected so that lenslets collect light up to an emission angle θ of about 75° as measured from a normal of the spots. Such factors can be independent of the number of spots, however it is assumed that the number of spots is greater than or equal to three.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

An aspect of the specification provides a system comprising: a light source configured to emit excitation light at an excitation wavelength; a heatsink; a wavelength conversion material located on the heatsink, the wavelength conversion material comprising a relative wavelength conversion area of unity divided into an array of spots, a number of the spots in a range of 4 to 12, the wavelength conversion material configured to emit light at a wavelength greater than the excitation wavelength when irradiated by the excitation light; and, an array of lenslets configured to: receive the excitation light from the light source and irradiate each of the spots of the wavelength conversion material with the excitation light, the lenslets in a one-to-one relationship with the number of spots; and collect the light emitted by the wavelength conversion material.

A distance between a light emitting surface of the spots and a light receiving surface of the lenslets, and a centre-to-centre distance between the spots can be selected so that lenslets collect light up to an emission angle θ of about 75° as measured from a normal of the spots.

One or more of $5d \leq t \leq 25d$ and $10d \leq t \leq 20d$, where d is a centre-to-centre distance between the spots and t is a largest lateral dimension of the spots, can be used to select the centre-to-centre distance between the spots.

A distance h between a light emitting surface of the spots and a light receiving surface of the lenslets, can be selected so that the lenslets collect light up to an emission angle of about 75° from the spots as measured from a normal of the spots.

An absolute wavelength conversion area of the array of spots can be in a range of about 2 mm² to about 100 mm².

An absolute wavelength conversion area of the array of spots can be in a range of about 4 mm² to about 20 mm².

The array of lenslets can comprise a collimating lens array.

The array of lenslets can comprise an integrated lens array.

The system can further comprise a mirror configured to: reflect the excitation light from the light source towards the array of lenslets; and, transmit the light emitted by the wavelength conversion material that is collected by the lenslets.

The excitation light can comprise blue light.

The light emitted by the wavelength conversion material can comprise one or more of green light and red light.

The heatsink can comprise a thermal conductivity in a range of about 50 to about 600 W/mK.

The light source can comprise a laser.

The light source can further comprise one or more optical devices configured to shape the excitation light to an area of the array of lenslets.

The wavelength conversion material can comprise a phosphor.

The wavelength conversion material can comprise quantum dots.

The heatsink can be stationary.

The heatsink can be configured to rotate.

The present specification also provides a system comprising: a light source configured to emit excitation light at an excitation wavelength; a heatsink; a wavelength conversion material located on the heatsink, the wavelength conversion material comprising a relative wavelength conversion area of unity divided into an array of spots, wherein, one or more of $5d \leq t \leq 25d$ and $10d \leq t \leq 20d$, where d is a centre-to-centre distance between the spots and t is a largest lateral dimension of the spots, is used to select the centre-to-centre distance between the spots; and, an array of lenslets configured to: receive the excitation light from the light source and irradiate each of the spots of the wavelength conversion material with the excitation light, the lenslets in a one-to-one relationship with the number of spots; and collect the light emitted by the wavelength conversion material. A number of the spots can be one or more of: greater than or equal to three; in a range of three to twenty, inclusive; and in a range of four to sixteen, inclusive.

Indeed, also disclosed is a system comprising: a light source configured to emit excitation light at an excitation wavelength; a heatsink; a wavelength conversion material located on the heatsink, the wavelength conversion material comprising a relative wavelength conversion area of unity divided into an array of spots; and, an array of lenslets configured to: receive the excitation light from the light source and irradiate each of the spots of the wavelength conversion material with the excitation light, the lenslets in a one-to-one relationship with the number of spots; and collect the light emitted by the wavelength conversion material, wherein a distance between a light emitting surface of the spots and a light receiving surface of the lenslets, and a centre-to-centre distance between the spots is selected so that lenslets collect light up to an emission angle θ of about 75° as measured from a normal of the spots. A number of the spots can be one or more of: greater than or equal to three; in a range of three to twenty, inclusive; and in a range of four to sixteen, inclusive.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
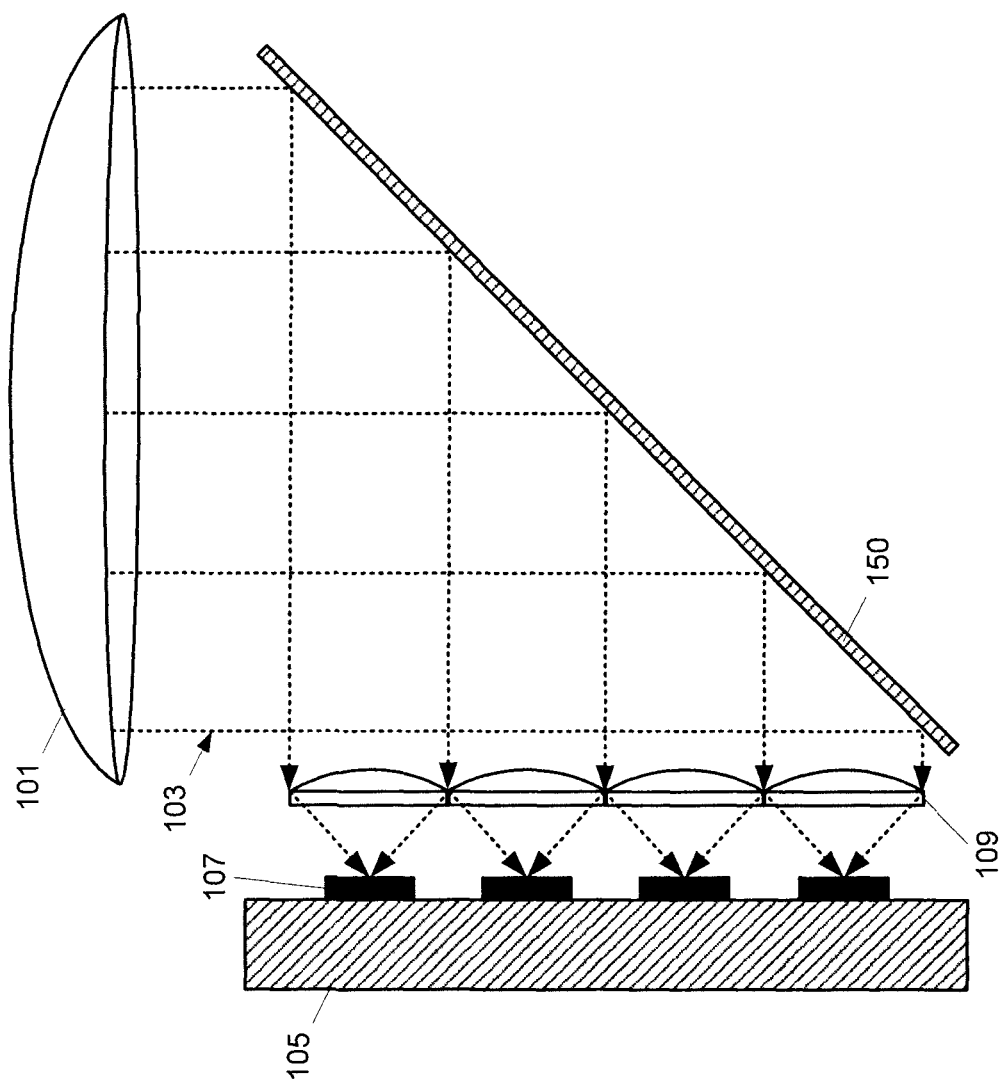
FIG. 1 depicts a system that includes a wavelength conversion material array being irradiated by excitation light, according to non-limiting implementations.
Figure 2:
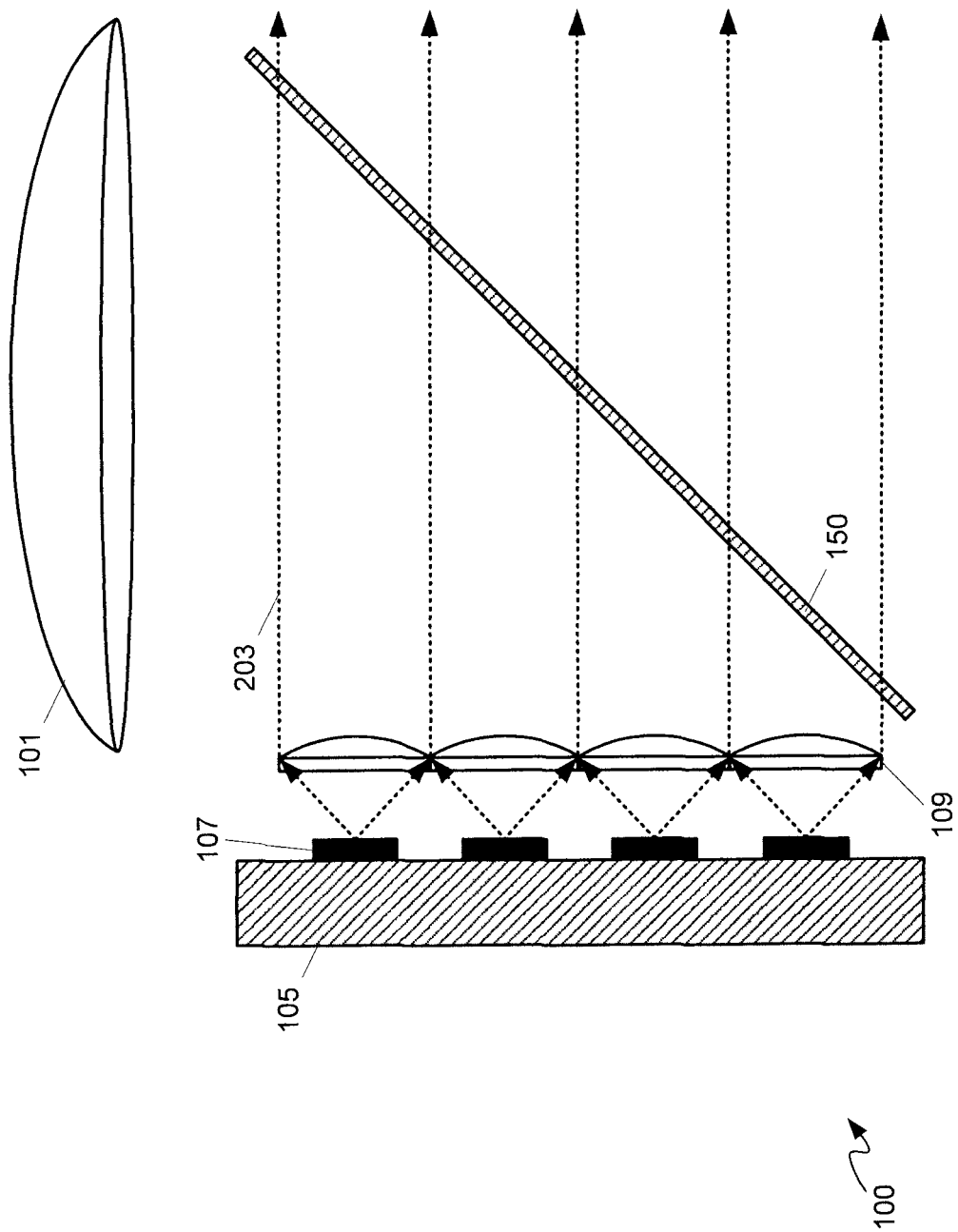
FIG. 2 depicts the system of FIG. 1 with light emitted by the wavelength conversion material array being collected, according to non-limiting implementations.

FIGS. 1 and 2 each depicts a side view of a system 100 comprising: a light source 101 configured to emit excitation light 103 at an excitation wavelength; a heatsink 105 (depicted in cross-section); a wavelength conversion material located on heatsink 105, wavelength conversion material comprising a relative wavelength conversion area of unity divided into an array of spots 107, a number of the spots in a range of 4 to 12, the wavelength conversion material configured to emit light at a wavelength greater than the excitation wavelength when irradiated by excitation light 103; an array of lenslets 109 configured to: receive excitation light 103 from light source 101 and irradiate each of spots 107 of the wavelength conversion material with excitation light 103, lenslets 109 in a one-to-one relationship with the number of spots 107; and collect light 203 emitted by the wavelength conversion material. In particular, FIG. 1 depicts spots 107 being irradiated with excitation light 103, and FIG. 2 depicts spots 107 emitting light 203; while these two processes are depicted separately, it is appreciated they occur simultaneously and/or in tandem. Hence, as spots 107 are irradiated with excitation light 103, spots 107 emit light 203. It is further noted that ranges provided herein are inclusive of the beginning and end numbers unless otherwise explicitly stated. Hence, a number of spots in range of 4 to 12 includes: 4 spots, 5 spots, 6 spots, etc., up to and including 12 spots.

Furthermore, while only one spot 107 is numbered, four spots 107 are depicted. Further, each of spots 107 comprises the wavelength conversion material. Similarly, while only one ray of excitation light 103, and one ray of light 203, are numbered, four of each are depicted.

As depicted, system 100 further comprises a mirror 150 configured to: reflect excitation light 103 from light source 101 towards the array of lenslets 109 (as depicted in FIG. 1); and, transmit light 203 emitted by spots 107 that is collected by lenslets 109 (as depicted in FIG. 2).

While not depicted, system 100 can comprise components of a projection system, and the like, such that light 203 irradiates a light modulator, and the like (including, but not limited to a digital micromirror device (DMD)), which is controlled by a processor to form an image from light 203, which is then conveyed to projection optics.

Light source 101 can comprise a laser light source, including, but not limited to, a blue laser light source. Hence, some implementations, excitation light 103 comprises blue light and, in particular, blue laser light. While not depicted, light source 101 can further comprise one or more optical devices configured to shape the laser light to an area of the array of lenslets 109. Other types of light sources 101 are within the scope of present implementations, including, but not limited to quantum dots, and the like.

With reference to FIG. 1, excitation light 103 is emitted by light source 101, and excitation light 103 impinges on mirror 150, which is at an angle that reflects excitation light 103 towards the array of lenslets 109. An area of excitation light 103 is similar to an area of the array of lenslets, and excitation light 103, mirror 150 and the array of lenslets 109 can be aligned so that outer edges of the area of excitation light 103 are about aligned with respective outer edges of the array of lenslets 109 so as to avoid discarding and/or wasting excitation light 103.

Furthermore, as depicted, excitation light 103 is collimated. When excitation light 103 comprises laser light, excitation light 103 is inherently collimated, however light source 101 can comprise optical components configured to collimate excitation light 103.

Mirror 150 comprises any set of optical components configured to: reflect excitation light 103 from light source 101 towards the array of lenslets 109, as depicted in FIG. 1; and, transmit light 203 emitted by spots 107 that is, in turn, collected by lenslets 109, as depicted in FIG. 2. Mirror 150 can include, but is not limited to, one or more dichroic mirrors.

In general, the process of exciting spots 107 to emit light 203 results in the production of heat which is to be dissipated to prevent spots 107 and heatsink 105 from heating up and/or to control a temperature of spots 107. As spots 107 emits light 203, heat flows into heatsink 105 from the interface between spots 107 and heatsink 105, the heat being dissipated at heatsink 105. Hence, heatsink 105 comprises one or more of a heatsink, a block, a wheel, a ring, one or more extrusions or other heat sink design (e.g. for air cooling), a water-block, a vapour chamber, a heat spreader, and the like, configured to cool spots 107. As such, heatsink 105 can comprise any material configured to cool spots 107 including, but not limited to, metal, aluminum, steel and the like. Heatsink 105 can be stationary or configured to rotate. In general, heatsink 105 can be characterized by its thermal conductivity, K, which can be in a range of about from about 50 to about 600 W/mK; in some implementations, a thermal conductivity of heatsink 105 can be in a range of about 150 to about 400 W/mK. Regardless, an ability of heatsink 105 to dissipate heat increasing as the thermal conductivity increases.

Wavelength conversion material (i.e. each spot 107) can generally comprise a phosphor configured to convert excitation light 103 to light 203, which is generally of a longer wavelength than excitation light 103. Hence, in implementations where excitation light 103 comprises blue light (and/or radiation of a wavelength shorter than red light and/or green light), light 203 emitted by the wavelength conversion material can comprise one or more of green light and red light. However, in other implementations, wavelength conversion material can comprise other materials configured to emit light 203 when irradiated by excitation light 103 including, but not limited to, quantum dots.

Furthermore, a total area of spots 107, not including spaces in between spots 107, has a total relative wavelength conversion area of unity, but divided between the 4 to 12 spots 107 (though, as depicted in FIGS. 1 and 2, there are four spots 107).

In other words, when configuring system 100, a determination is made of a total wavelength conversion area that is to be used to reach a light throughput design goal; the determined total wavelength conversion area can be assigned an arbitrary value of unity, and the total area is divided between spots 107. In other words, the area of each spot 107 can comprise the total wavelength conversion area divided by the number of spots. This assumes that each spot 107 has about the same area, however, in other implementations, one or more spots 107 can have a different area from other spots 107, as long as the total wavelength conversion area remains the same. Distances between spots 107 are described below with respect to FIGS. 8 and 9.

Lenslets 109 are provided in a one-to-one relationship with spots 107. In other words, a number of lenslets 109 in the array of lenslets 109 is the same as the number of spots 107. Furthermore, as depicted, each lenslet 109 can be centred on a corresponding spot 107. As depicted, the array of lenslets 109 comprises an integrated lens array, however, in other implementations, the array of lenslets 109 can comprise separate and/or non-integrated lens arrays. For example, each lenslet 109 can be held in place using a frame, and the like.

Furthermore, as depicted, light 103 is focused by each lenslet 109 onto a corresponding spot 107, and light 203 emitted by each spot 107 is collected by a corresponding lenslet 109 and collimated, as depicted in FIG. 2. Collimated light 203 is transmitted through mirror 150 and travels to other components of a projection system, as described above.

Furthermore, an area of spots 107 on heatsink 105, including spaces in between spots 107 can be less than or equal an area of the array of lenslets 109. In other words, outer edges of the array of lenslets 109 can be greater than the outer edges of outer spots 107 in the array of spots 107.

Furthermore, a respective area of each lenslet 109 can be greater than an area of a respective spot 107, with a centre of each lenslet 109 about aligned with a centre of a respective spot 107 so that light 203 emitted from each spot 107 is collected by a respective lenslet 109; while light 203 can also be collected by an adjacent lenslet 109, light emitted by outer spots 107 in the array of spots 107 can be lost when the area of a corresponding lenslet 109 is smaller than the area of light 203. In addition, the collection efficiency of lenslets 109 depends on a distance between spots 107 and lenslets 109, as well as an etendue of light 203 as light 203 is emitted from each spot 107. Such considerations can be taken into account when selecting a distance between spots 107 and lenslets 109. In particular, a distance from spot 107 to lenslet 109 can be less than abut 5 mm, and/or less than about 2 mm, as described below with respect to FIG. 8. However, the total area of lenslets 109 and spots 107 (including spaces there between) can be selected to ensure optimized optical throughput as described in more detail below.

Indeed, as each lenslet 109 focuses light 103 towards a centre of a respective spot 107, similar to how a lens would focus light onto a single spot of wavelength conversion material having a total area similar to the total wavelength conversion area of spots 107, etendue of light 203 is generally unchanged as compared to the prior art. However, as spots 107 get further apart, while thermal dissipation in heatsink 105 can improve, the optical throughput can decrease as it becomes more difficult to collect light 203 at larger angles as the number of spots 107 increase. Hence, a number of spots 107 can be in a range of 4 to 12, inclusive, as described hereafter.

Figure 3:
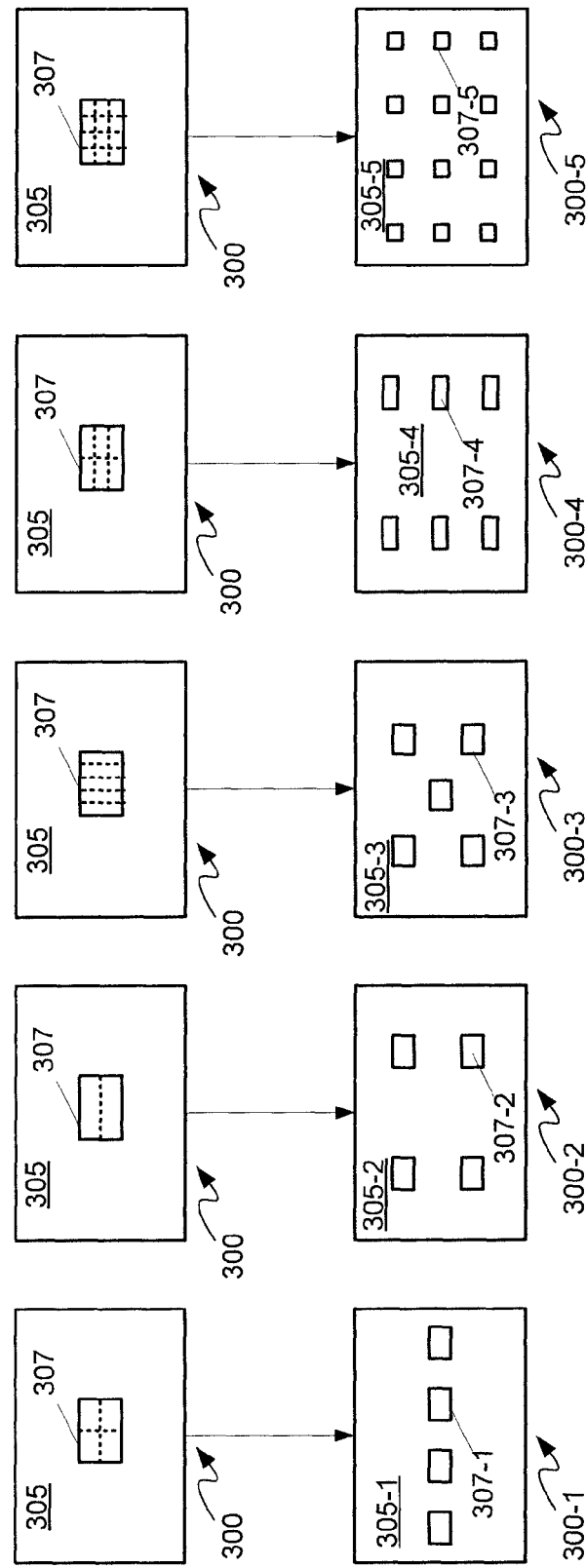
FIG. 3 depicts various examples of numbers of spots of a wavelength conversion material array on heatsinks, and division of a wavelength conversion material having an area of unity into 4 to 12 spots, inclusive, according to non-limiting implementations.

For example, attention is next directed to FIG. 3 which depicts various examples of heatsink/arrays of spots of wavelength conversion materials, referred to hereafter as systems 300, 300-1, 300-2, 300-3, 300-4, 300-5, respectively comprising one, four, four, five, six and twelve spots. Each of systems 300, 300-1, 300-2, 300-3, 300-4, 300-5 comprise a respective heatsink 305, 305-1, 305-2, 305-3, 305-4, 305-5 similar to heatsink 105, the boundaries of which are represented by an outer large rectangle, and respective spots 307, 307-1, 307-2, 307-3, 307-4, 307-5, each similar to spots 107, represented by smaller rectangles inside respective heatsinks.

System 300 is depicted above each of systems 300-1, 300-2, 300-3, 300-4, 300-5, with one spot 307 depicted as divided into four, four, five, six and twelve spots using stippled lines, with spot 307 hence having a same wavelength conversion area as, respectively, the total wavelength conversion area of four spots 307-1, four spots 307-2, five spots 307-3, six spots 307-4 and twelve spots 307-5. While each spot 307, 307-1, 307-2, 307-3, 307-4, 307-5 is depicted as rectangular, other shapes of spots 307, 307-1, 307-2, 307-3, 307-4, 307-5 are within the scope of present implementations, including, but not limited to, circular, square, triangular, etc. Further, while each set of spots 307, 307-1, 307-2, 307-3, 307-4, 307-5 has a same respective shape, in other implementations, spots 307, 307-1, 307-2, 307-3, 307-4, 307-5 within each set can have different shapes.

Regardless, the total wavelength conversion area of each of spots 307, 307-1, 307-2, 307-3, 307-4, 307-5 for each of systems 300-1, 300-2, 300-3, 300-4, 300-5 are all about the same, the total wavelength conversion area not including the spaces in-between spots 307-1, 307-2, 307-3, 307-4, 307-5. In other words, the area of wavelength conversion material for each of systems 300-1, 300-2, 300-3, 300-4, 300-5 is about the same. Hence, a respective area of each of spots 307-1 and spots 307-2 is about one quarter an area of spot 307. Similarly: a respective area of each of spots 307-3 is about one fifth an area of spot 307; a respective area of each of spots 307-4 is about one sixth an area of spot 307; and, a respective area of each of spots 307-3 is about one twelfth an area of spot 307.

In other words, if spot 307 is assigned a relative wavelength conversion area of unity, the total wavelength conversion area of each of spots 307-1, 307-2, 307-3, 307-4, 307-5 is unity divided by a number in a range of 4 to 12.

Systems 300-1, 300-2 each have four spots, but arranged in different configurations; hence the configuration of spots of each of systems 300-1, 300-2, 300-3, 300-4, 300-5 can vary from those depicted.

It is further appreciated that when any of systems 300-1, 300-2, 300-3, 300-4, 300-5 are incorporated into system 100, the array of lenslets 109 is adapted to irradiate respective spots and collect light therefrom as described above. Furthermore, any of systems 300-1, 300-2, 300-3, 300-4, 300-5 can be adapted to include any number of spots in a range of 4 spots to 12 spots.

In addition, the number of spots increase, the higher the relative heat flux of a respective heat sink, assuming that the temperature limit of the wavelength conversion material remains unchanged as the number of spots increase. For example, the temperature limit of the wavelength conversion material remaining unchanged can include a maximum spot temperature being about the same in all configurations (e.g. when the heat removal is increased due to a configuration of spots of wavelength conversion material, the incident power of excitation light can be increased proportionally so that the temperature of a spot is constant between configurations).

Figure 4:
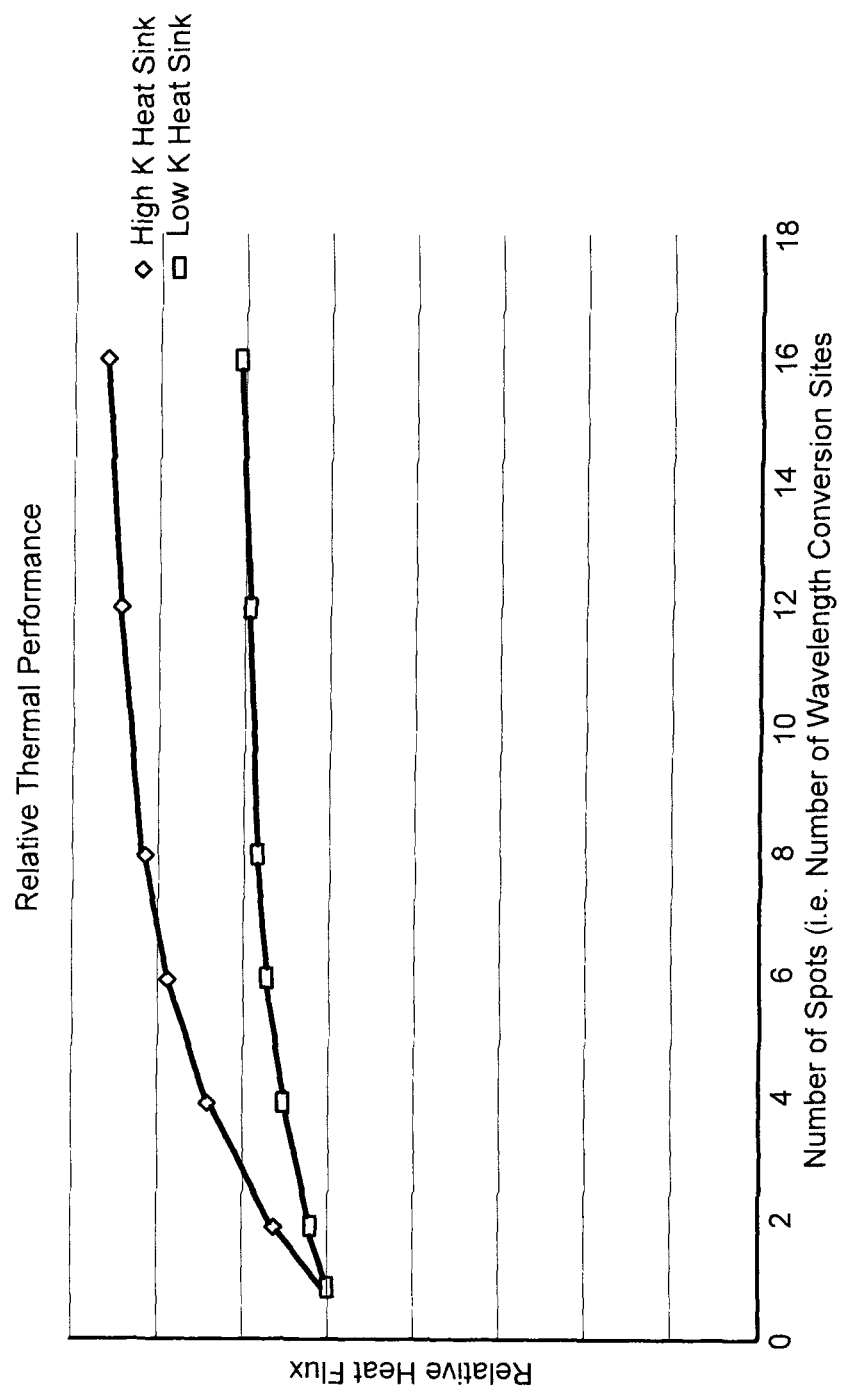
FIG. 4 depicts heat flux as a function of a number of spots of a wavelength conversion material array, according to non-limiting implementations.

For example, attention is next directed to FIG. 4, which depicts relative thermal performance of system 100 adapted for a number of spots 107 ranging from 1 spot to 16 spots, for heatsink 105 having both a "High K" and a "Low K" thermal conductivity. For example, a High K thermal conductivity can be about 400 W/mK and a Low K conductivity can be about 150 W/mK. However, the selection of the "High K" and a "Low K" thermal conductivity for FIG. 4 is generally arbitrary and each of the curves in FIG. 4 is meant to demonstrate that relative thermal performance of system 100 remains the same regardless of thermal conductivity of heatsink 105. Specifically, FIG. 4 depicts the relative possible heat flux in heatsink 105 as the number of spots 107 (i.e. a number of wavelength conversion sites) increase, for different relative thermal conductivities of heatsink 105. Regardless of thermal conductivity, however, it is clear that relative heat flux increases with the number of spots 107. On the other hand, the thermal benefit from increasing the number of wavelength-conversion spots 107 diminishes asymptotically.

Figure 5:
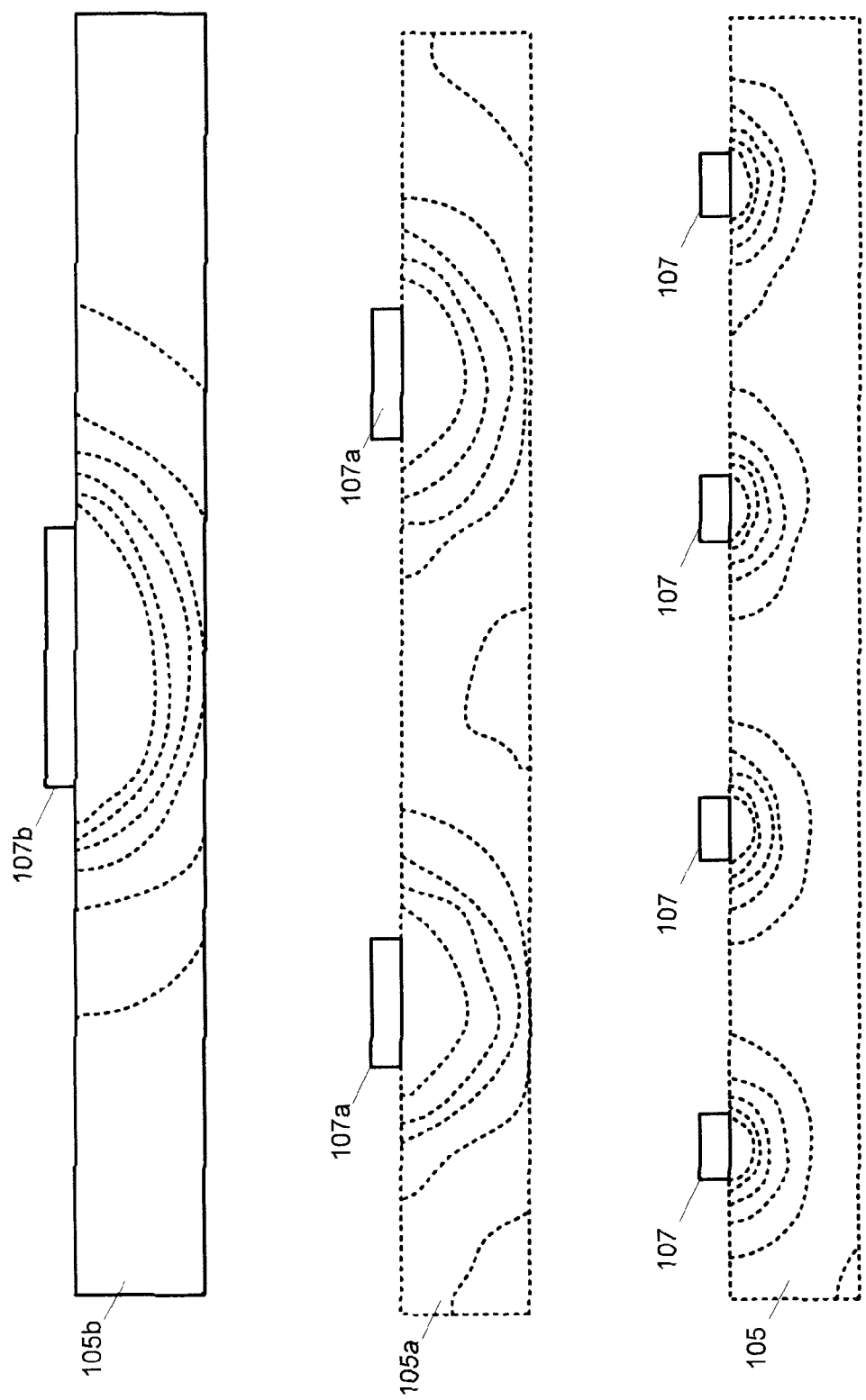
FIG. 5 depicts heat flux in heatsinks with different numbers of spots of a wavelength conversion material array, according to non-limiting implementations.

This phenomenon is depicted schematically in FIG. 5 which depicts lines heat flux (depicted as stippled lines) in each of heatsink 105, a heatsink 105a, and a heatsink 105b, each of which are similar, other than a number of spots 107, 107a, 107b located thereupon. For example, there are four spots 107 on heatsink 105, two spots 107a on heatsink 105a, and one spot 107b on heatsink 105b. The respective total areas of spots 107, 107a and 107b are all about the same. Hence, spots 107 have about the same area as spot 107b, but spots 107 are spread out over a larger area. Hence, as can be seen from lines of heat flux in heatsink 105, as compared to lines of heat flux in heatsink 105b, heat flux is less concentrated in heatsink 105, hence heatsink 105 can dissipate a larger amount of heat than heatsink 105b (e.g. in a same time period).

Heat flux in heatsink 105a with two spots 107a is intermediate heat flux in heatsink 105 and heatsink 105b. Indeed, for heatsink 105a with two spots 107a, the potential heat load is 50% greater than heatsink 105b with a single spot 107b for the same total light emitting area and temperature limit of the wavelength-conversion material: i.e. based on the thermal limit, the configuration of heatsink 105a and spots 107a can generate 50% more converted light than heatsink 105b with a single spot 107b.

Figure 6:
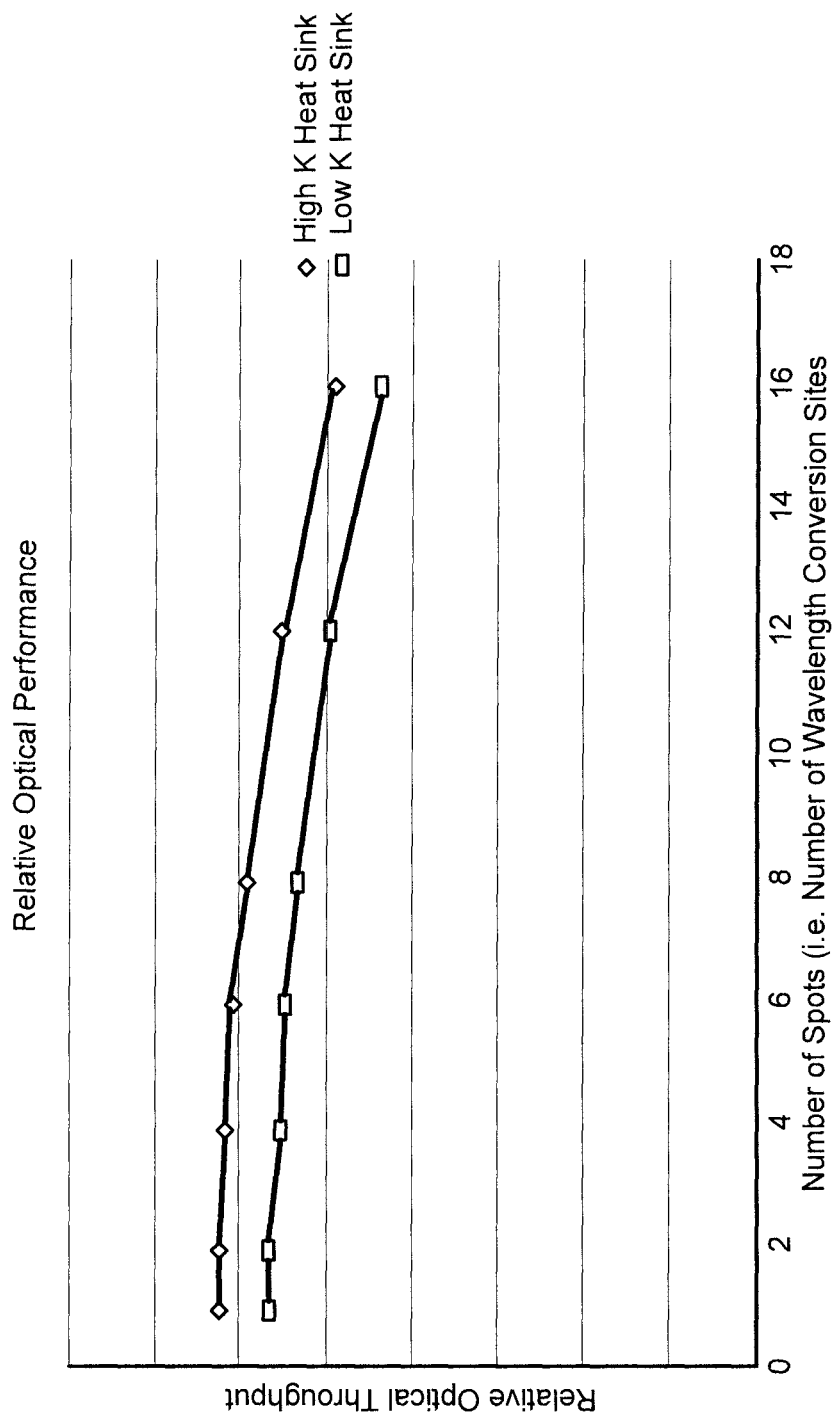
FIG. 6 depicts optical throughput of system 100 as a function of a number of spots of a wavelength conversion material array, according to non-limiting implementations.

However, optical throughput generally decreases as the number of spots 107 increases as depicted in FIG. 6, which is similar to FIG. 4, but depicts relative optical throughput of system 100 as a number of spots 107 increases. While optical throughput for heatsink 105 having a relatively High K and a relatively Low K thermal conductivity are depicted as being separated from each other, such separation is only for clarity and in general there is no dependency of optical throughput on the thermal conductivity of heatsink 105. Indeed, each of the curves in FIG. 6 can directly overlap.

In any event, optical throughput generally decreases with a number of spots 107 as spacing between spots begins to limit the angular collection angle of the light 203 by lenslets 109. In other words, the optical collection efficiency of system 100 decreases with an increasing number of wavelength conversion spots 107 as the spacing between spots 107 begins to limit the angular collection angle of the converted light 203 by lenslets 109.

In general, the precise decrease is geometrically dependent on a geometry of the array of spots 107 and/or the array of lenslets 109, but the relative decreases depicted in FIG. 6 generally occur. In other words, as the number of spots 107 increase light 203 to be collected by lenslets 109 spreads out so it becomes harder to collect.

Figure 7:
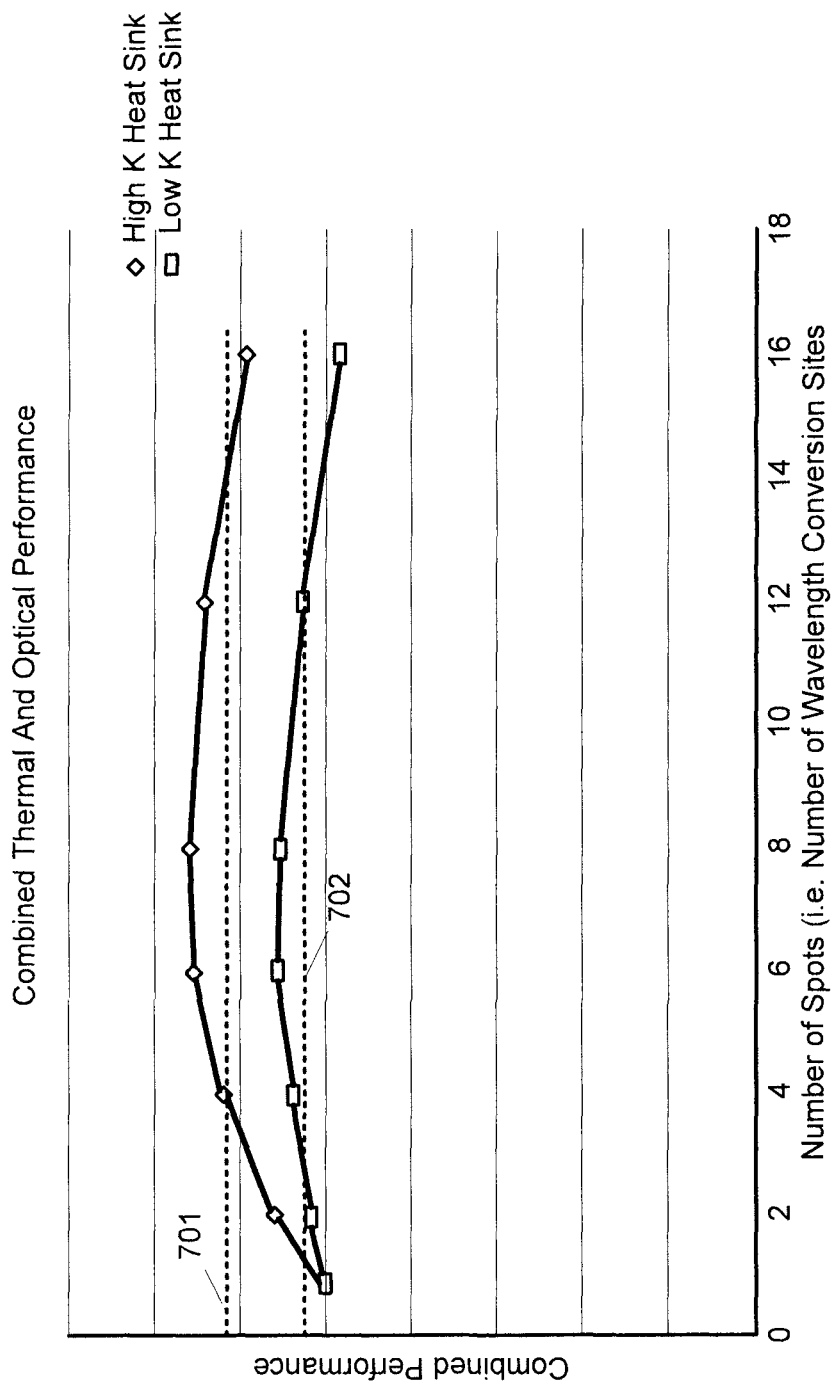
FIG. 7 depicts optical throughput of system 100 as a function of a number of spots of a wavelength conversion material array, according to non-limiting implementations.

In any event, attention is next directed to FIG. 7 which depicts the curves in FIG. 4 multiplied by the respective curves in FIG. 6, and hence the combined optical and thermal performance of system 100 as the number of spots 107 increases. As is clear from FIG. 7, peak performance occurs in a range of 4 spots to 12 spots, inclusive, as determined empirically, and as indicated by portions of the High K curve that are above line 701, and portions of the Low K curve that are above line 702. Furthermore, cost of the array of lenslets 109 can increase after about 12 spots.

Regardless, as the thermal performance increases, higher energy levels of light incident to the wavelength conversion material can be used, which can lead to more light output, as compared to a single spot of wavelength conversion material system.

In addition, the wavelength conversion area of the array of spots 107 can be selected based on cost and a size of heatsinks available on the market, as well as based on light collection efficiencies. As described above, while present implementations include total wavelength conversion areas of spot arrays disclosed herein can include areas in a range of about 2 mm$^2$ to about 100 mm$^2$, cost and optical efficiency can be better in a range of about 4 mm$^2$ to about 20 mm$^2$. In specific non-limiting implementations an area of the array of spots 107 can be about 4.5 mm$^2$ and/or about 1.5 mm×3 mm. However, a distance between spots 107 and a distance between spots 107 and lenslets 109 can also be selected to achieve a balance between heat flow in heatsink 105 and optical collection efficiency of lenslets 109 as described hereafter with reference to FIGS. 8 and 9.

Figure 8:
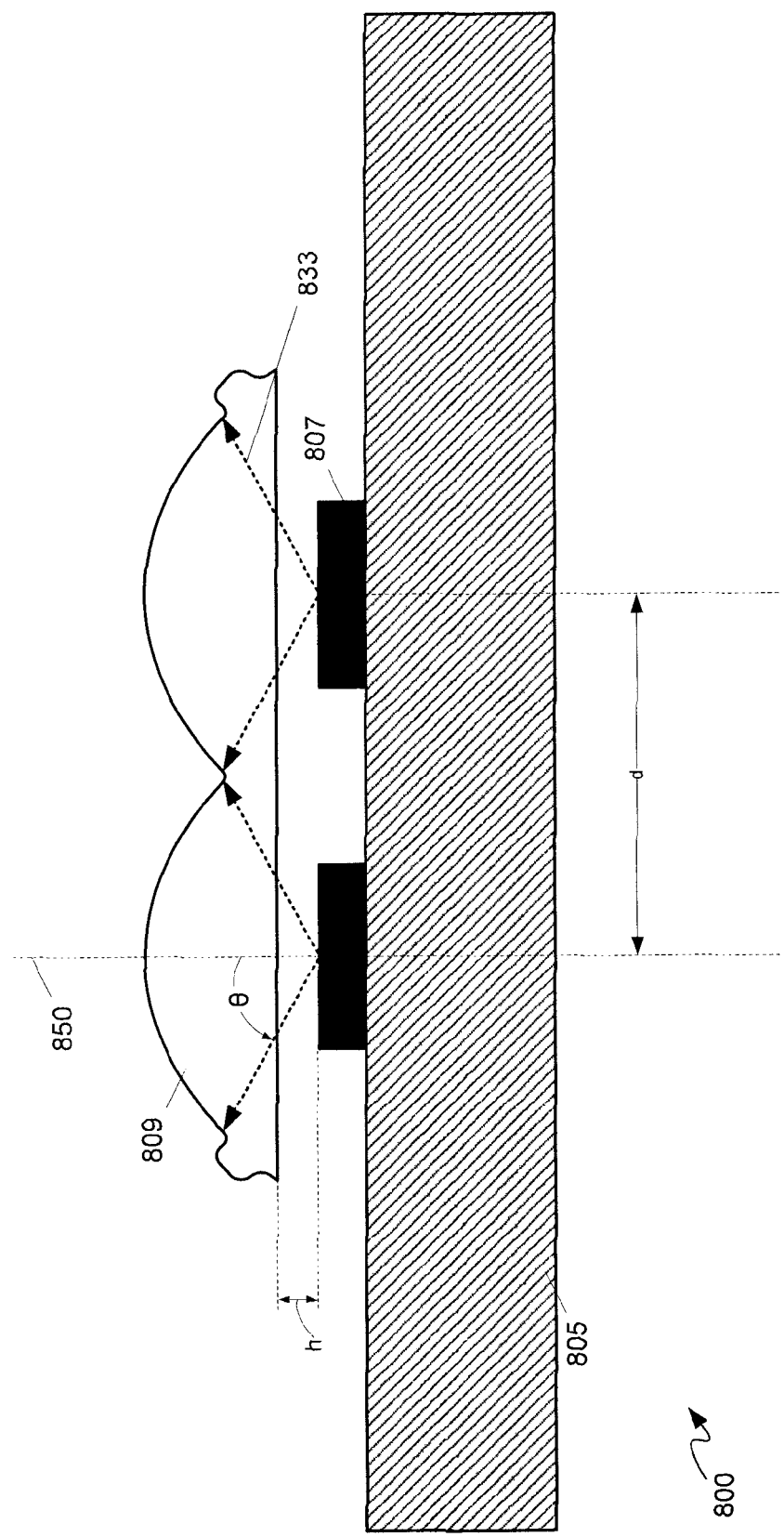
FIG. 8 depicts a geometry of a system that includes a wavelength conversion material array being irradiated by excitation light, according to non-limiting implementations.

Hence, attention is next directed to FIG. 8 which depicts a non-limiting implementation of a system 800 that is substantially similar to system 100 with like elements having like numbers, however in an "800" series rather than a "100" series. For example, system 800 comprises a heatsink 805, spots 807 of a wavelength conversion material and an array of lenslets 809. Further, while only two spots 807 and two lenslets 809 are depicted, it is appreciated that system 800 comprises a number of spots 807 in a range of 4 to 12, with a corresponding number of lenslets 809. Furthermore, while a light source is not depicted, it is appreciated that a light source similar to light source 100 is nonetheless present in system 100, as well as a mirror similar to mirror 150. While lenslets 809 have a shape different from lenslets 109, system 800 merely demonstrates that various shapes of lenslets are within the scope of present implementations.

Also depicted in system 800 is a distance h between a light emitting surface of spots 807 and a light receiving surface of lenslets 809, as well as an emission angle θ of light 833 from spots 807 as measured from a normal 850 of spots 807. Also depicted is a centre-to-centre distance d between spots 807 (which can also be referred to as a spot-spacing distance h). In general, lenslets 809, distance h and distance d are selected so that lenslets 809 collect light 833 emitted from spots 807 up to and including about a 75° angle; in other words light up to an emission angle θ of about 75°. For example, distance h can be less than abut 5 mm, and/or less than about 2 mm.

However, as spots 807 (and/or spots 107 etc.) are placed further apart, while heat flow in heatsink 805, and the like, can increase, it can become more difficult to collect emitted light. For example, spacing between spots can be a function of the optical collection angle and distance to lenslet arrays. The collection angle can be 75° as described above. As collection angle increases beyond 75°, it becomes harder for the optics of the lenslets to accept and collimate the light. Hence, as a collection angle decreases below 75°, a smaller amount of the emitted light is captured. This accounts for the drop off in optical efficiency in FIG. 6. Nonetheless, a distance between spots can be selected to balance heat flow with optical efficiency.

Figure 9:
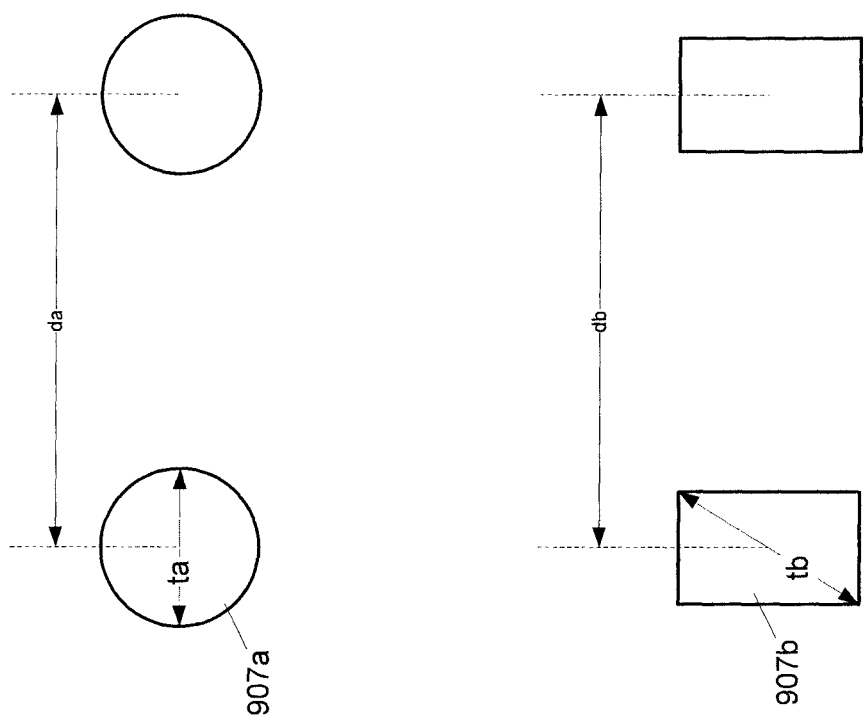
FIG. 9 depicts various dimensions of the wavelength conversion material array, according to non-limiting implementations.

For example, attention is next directed to FIG. 9 which depicts two sets of example spots 907a and spots 907b, as well as a centre-to-centre distance da between spots 907a and a centre-to-centre distance 2b between spots 907b, distances da, db similar to distance d in FIG. 8. Also depicted are a largest lateral spot dimension ta of spots 907a, and a largest lateral spot dimension tb of spots 907b. In the case of spots 907a, as they are circular, the largest lateral spot dimension ta comprises a diameter of each spot 907a, assuming each spot 907a has about the same diameter. In the case of spots 907b, as they are rectangular, the largest lateral spot dimension tb comprises a corner-to-corner diagonal of each spot 907b, assuming each spot 907a has about the same rectangular shape. However, other spot shapes are within the scope of present implementations, and hence other largest lateral spot dimension are within the scope of present implementations. Furthermore there is no requirement that each spot of wavelength conversion material be the same shape; indeed, in implementations where spots are of different shapes and/or different dimensions, an average largest lateral spot dimension and/or a median largest lateral spot dimension, and the like, could be used in the following determination.

In particular, it has been empirically determined that a balance between optical collection efficiency of lenslets and heat flow in a heatsink can be achieved when a centre-to-centre distance (i.e. distance d, da, db and the like) is between about 5 times and about 25 times, inclusive, the largest lateral spot dimension of spots. Indeed, in particular non-limiting implementations, a balance between optical collection efficiency of lenslets and heat flow in a heatsink can be achieved when a centre-to-centre distance (i.e. distance d, da, db and the like) is between about 10 times and about 20 times, inclusive, the largest lateral spot dimension of spots. This can be expressed mathematically as: $5d \leq t \leq 25d$ and/or $10d \leq t \leq 20d$, where d is the centre-to-centre distance between spots and t is the largest lateral dimension of spots.

Hence, also disclosed herein is a system comprising: a light source configured to emit excitation light at an excitation wavelength; a heatsink; a wavelength conversion material located on the heatsink, the wavelength conversion material comprising a relative wavelength conversion area of unity divided into an array of spots, wherein, one or more of $5d \leq t \leq 25d$ and $10d \leq t \leq 20d$, where d is a centre-to-centre distance between the spots and t is a largest lateral dimension of the spots, is used to select the centre-to-centre distance between the spots; and, an array of lenslets configured to: receive the excitation light from the light source and irradiate each of the spots of the wavelength conversion material with the excitation light, the lenslets in a one-to-one relationship with the number of spots; and collect the light emitted by the wavelength conversion material. In these implementations, a number of spots can be one or more of: greater than or equal to three; in a range of three to twenty, inclusive; and in a range of four to sixteen, inclusive.

Indeed, also disclosed is a system comprising: a light source configured to emit excitation light at an excitation wavelength; a heatsink; a wavelength conversion material located on the heatsink, the wavelength conversion material comprising a relative wavelength conversion area of unity divided into an array of spots; and, an array of lenslets configured to: receive the excitation light from the light source and irradiate each of the spots of the wavelength conversion material with the excitation light, the lenslets in a one-to-one relationship with the number of spots; and collect the light emitted by the wavelength conversion material, wherein a distance between a light emitting surface of the spots and a light receiving surface of the lenslets, and a centre-to-centre distance between the spots is selected so that lenslets collect light up to an emission angle θ of about 75° as measured from a normal of the spots. In these implementations, a number of spots can be one or more of: greater than or equal to three; in a range of three to twenty, inclusive; and in a range of four to sixteen, inclusive.

Provided herein is a system in which wavelength conversion material on a heatsink is separated into 4 to 12 spots (inclusive) to yield a thermal benefit. The exact amount of benefit can be a function of the material properties of the heatsink (particularly the thermal conductivity (K)), heatsink performance, and the spot size and spacing. Furthermore, as the thermal performance of a heatsink increases as the number of spots increase, higher energy levels of light incident to the wavelength conversion material can be used, which can lead to more light output, as compared to a single spot of wavelength conversion material system. However, other factors can be used to determine a configuration of the spots. For example, one or more of $5d \leq t \leq 25d$ and $10d \leq t \leq 20d$, where d is a centre-to-centre distance between the spots and t is a largest lateral dimension of the spots, can be used to select the centre-to-centre distance between the spots; and/or a distance between a light emitting surface of the spots and a light receiving surface of the lenslets, and a centre-to-centre distance between the spots, can be selected so that lenslets collect light up to an emission angle θ of about 75° as measured from a normal of the spots. Such factors can be independent of the number of spots, however it is assumed that the number of spots is greater than or equal to three.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A system comprising:
a light source configured to emit excitation light at an excitation wavelength;
a heatsink;
a wavelength conversion material located on the heatsink, the wavelength conversion material comprising a relative wavelength conversion area of unity divided into an array of spots, a number of the spots in a range of 4 to 12, the wavelength conversion material configured to emit light at a wavelength greater than the excitation wavelength when irradiated by the excitation light; and,
an array of lenslets configured to: receive the excitation light from the light source and irradiate each of the spots of the wavelength conversion material with the excitation light, the lenslets in a one-to-one relationship with the number of spots; and
collect the light emitted by the wavelength conversion material.

2. The system of claim 1, wherein a distance between a light emitting surface of the spots and a light receiving surface of the lenslets, and a centre-to-centre distance between the spots is selected so that lenslets collect light up to an emission angle θ of about 75° as measured from a normal of the spots.

3. The system of claim 1, wherein one or more of $5d \leq t \leq 25d$ and $10d \leq t \leq 20d$, where d is a centre-to-centre distance between the spots and t is a largest lateral dimension of the spots, is used to select the centre-to-centre distance between the spots.

4. The system of claim 1, wherein a distance h between a light emitting surface of the spots and a light receiving surface of the lenslets, are selected so that the lenslets collect light up to an emission angle of about 75° from the spots as measured from a normal of the spots.

5. The system of claim 1, wherein an absolute wavelength conversion area of the array of spots is in a range of about 2 $mm^2$ to about 100 $mm^2$.

6. The system of claim 1, wherein an absolute wavelength conversion area of the array of spots is in a range of about 4 $mm^2$ to about 20 $mm^2$.

7. The system of claim 1, wherein the array of lenslets comprising a collimating lens array.

8. The system of claim 1, wherein the array of lenslets comprises an integrated lens array.

9. The system of claim 1, further comprising a mirror configured to: reflect the excitation light from the light source towards the array of lenslets; and, transmit the light emitted by the wavelength conversion material that is collected by the lenslets.

10. The system of claim 1, wherein the excitation light comprises blue light.

11. The system of claim 1, wherein the light emitted by the wavelength conversion material comprises one or more of green light and red light.

12. The system of claim 1, wherein the heatsink comprises a thermal conductivity in a range of about 50 to about 600 W/mK.

13. The system of claim 1, wherein the light source comprises a laser.

14. The system of claim 1, wherein the light source further comprises one or more optical devices configured to shape the excitation light to an area of the array of lenslets.

15. The system of claim 1, wherein the wavelength conversion material comprises a phosphor.

16. The system of claim 1, wherein the wavelength conversion material comprises quantum dots.

17. The system of claim 1, wherein the heatsink is stationary.

18. The system of claim 1, wherein the heatsink is configured to rotate.

* * * * *